United States Patent [19]

Dougherty, Jr. et al.

[11] Patent Number: 4,602,271

[45] Date of Patent: Jul. 22, 1986

[54] PERSONALIZABLE MASTERSLICE SUBSTRATE FOR SEMICONDUCTOR CHIPS

[75] Inventors: William E. Dougherty, Jr., Poughkeepsie, N.Y.; Stuart E. Greer, Shelburne; William J. Nestork, Charlotte, both of Vt.; William T. Norris, Georgetown, Tex.

[73] Assignee: International Business Machines Corporation, Armonk, N.Y.

[21] Appl. No.: 682,963

[22] Filed: Feb. 15, 1984

Related U.S. Application Data

[63] Continuation of Ser. No. 285,725, Jul. 22, 1981, abandoned.

[51] Int. Cl.⁴ .................. H01L 39/04; H01L 23/02; H01L 23/08
[52] U.S. Cl. ........................................ 357/80; 357/68; 357/74; 361/414
[58] Field of Search ............... 357/68, 70, 74, 80; 361/414

[56] References Cited

U.S. PATENT DOCUMENTS 4,193,082  3/1980  Dougherty .................. 357/80
4,202,007  5/1980  Dougherty et al. ......... 357/80
4,220,917  9/1980  McMahon, Jr. ............. 357/70
4,322,778  3/1982  Barbour et al. ............ 357/74

OTHER PUBLICATIONS

Johnson et al., IBM Tech. Dis. Bulletin, vol. 22, #5, Oct. 1979, pp. 1841–1842, "Multilayer Ceramic Fixed Layer Substrate Design".

Primary Examiner—Martin H. Edlow
Assistant Examiner—John Lamont
Attorney, Agent, or Firm—Mark F. Chadurjian; Theodore E. Galanthay; William N. Hogg

[57] ABSTRACT

A substrate for packaging semiconductor chips is provided which is structured with conductors having opposite ends terminating in a mounting surface and intermediate portions extending beneath the surface. The ends of the conductors are arranged in repeating patterns longitudinally along the substrate separated by orthogonal strips free of conductor ends to allow for dense surface wiring. The repeating patterns are arranged to allow for chip mounting sites having sufficient spacing to allow for surface wiring. In this way chips in the same and repeat pattern can be connected by personalized surface wiring and preset substrate conductors.

3 Claims, 7 Drawing Figures

PERSONALIZABLE MASTERSLICE SUBSTRATE FOR SEMICONDUCTOR CHIPS

This application is a continuation of application Ser. No. 285,725, filed July 22, 1981, now abandoned.

BACKGROUND OF THE INVENTION

This invention relates to packaging of semiconductor chips, and more particularly, to a chip package wherein the substrate is provided with a repeating pattern of conductor ends, with each pattern defining sites to permit the reception of a variety of different chips. The conductor ends are wired to connect both within the same pattern and with adjacent patterns. This permits the personalization of a common substrate to receive many different combinations of chips.

In the evolution of semiconductor technology, packaging of the chips has taken on increasing importance. The number of circuits that can be placed on a chip has dramatically increased as has the number of functions of any given chip. There are chips which are primarily memory, those which are primarily logic, and those which are mixed logic and memory. As miniaturization progresses it is becoming increasingly desirable to place a number of different chips, and different combinations of chips onto a single substrate. This chip/substrate package can be inserted as a unit into various pieces of equipment.

However, with prior art technology each module having a different combination of chips had to have a substrate designed specifically for each combination of chips. Indeed, even in a single chip module, each different chip required a different substrate unique to the given chip. Prior art examples of technology for providing a substrate for a given chip or specific combination of chips is represented in U.S. Pat. Nos. 4,202,007 and 4,193,082 which represent one technology for making substrates with buried wiring, and *IBM Technical Disclosure Bulletin*, Vol. 22, No. 5 dated October 1979, at pages 1841-1842, which represents a different technology. This prior art, however, shows only a technique for forming substrates which will accept predetermined chips or chip combinations. The necessity of designing, producing and stockpiling a different substrate for each chip and each different combination of chips is very expensive and adds significantly to the cost.

SUMMARY OF THE INVENTION

According to the present invention, a substrate for packaging semiconductor chips is provided having a chip mounting surface. The substrate is structured with conductors having opposite ends terminating at said mounting surface with intermediate portions connecting the ends of the conductors. The ends of the conductors are arranged in repeating patterns longitudinally along the substrate separated by orthogonal strips on the surface which are free of conductor ends to allow for dense surface wiring. The intermediate portions of some conductors connect ends within a pattern and of some conductors connect ends in adjacent patterns. The conductor ends in each pattern are positioned to delineate a plurality of chip mounting sites having sufficient spacing between the conductor ends to permit the positioning of chip mounting means which may be electrically connected to the ends of the conductors by surface metallization.

In this way a single substrate can be personalized to accept a plurality of different chips at any given pattern location and to utilize two or more locations to mount chips with appropriate connections between.

The substrate of the present invention utilizes subsurface conductors to provide basic interconnection within each pattern and between adjacent patterns and surface wiring for the unique personalized chip mounting and wiring.

DESCRIPTION OF THE PREFERRED EMBODIMENT

Figure 1:
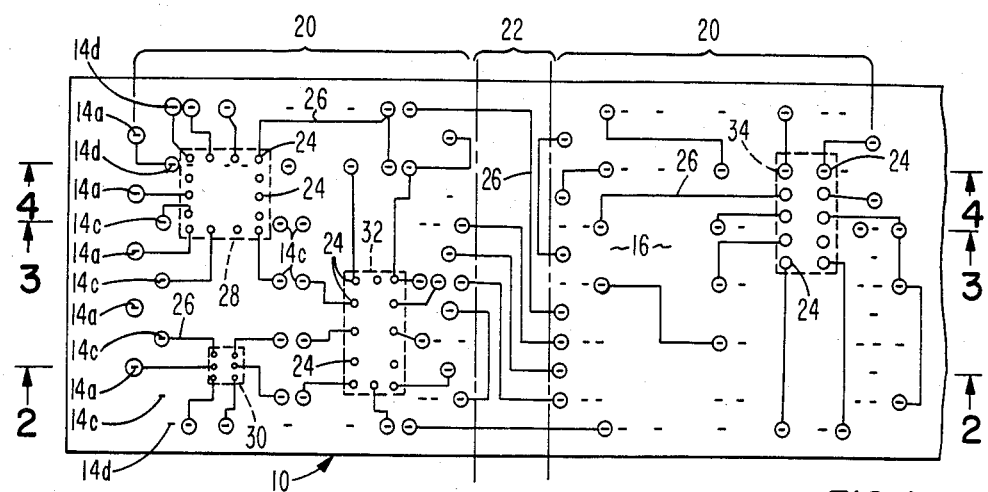
FIG. 1 is a plan view of a chip package of this invention showing the substrate and chips mounted thereon.

Referring now to the drawing, a substrate having two repeating patterns of surface termination of conductors is shown. It is to be understood that the substrate could be made longer with additional repeating patterns, but two are shown for the purpose of illustration.

Figure 5:
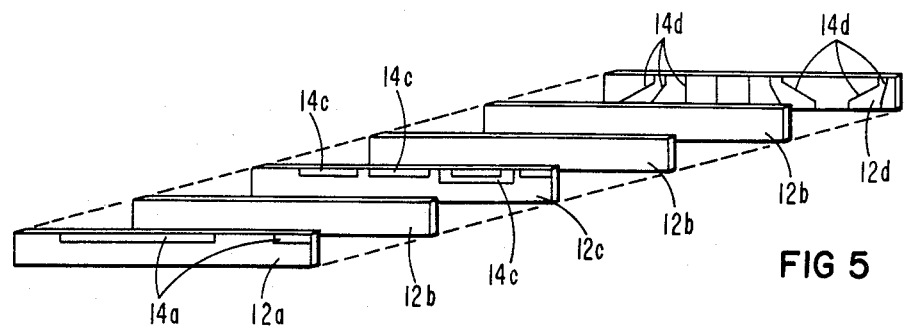
FIG. 5 is a perspective exploded view of some of the laminae utilized to form the substrate of FIG. 1, and FIGS. 6A and 6B are a plan view of another embodiment of the chip package of this invention.

The substrate, designated by the reference character 10, is formed from a plurality of different laminae, 12a, 12b, 12c, 12d, some of which are shown in FIG. 5. The laminae are thin sheets of green (uncured) ceramic or other dielectric material. Different laminae 12a, 12c, and 12d have formed on their faces electrical conductors 14a, 14c, 14d, respectively. The conductors 14a and 14c are in a pattern that starts at the top edge of the lamina, extends along the face below the top surface and returns again to the top surface. The conductors 14d extend from the top surface of the lamina along the face to the bottom surface. Some of the laminae represented by laminae 12b may have no conductors and are to control lateral spacing of the ends of the conductors.

The required number of the laminae, both with conductors and without, are assembled in face-to-face relationship with the conductor sides oriented in the same direction to form the substrate 10 with their top edges forming a chip mounting surface 16 and their opposite edges forming a reverse surface 18. The assembled ceramic laminae are cured in a conventional manner to form a unitary structure. The method of forming the laminae and the substrate from the laminae is well known in the art and described in said U.S. Pat. Nos. 4,202,007 and 4,193,082 commonly assigned.

As seen in the drawing, the completed substrate has on its top surface two patterns of conductor ends 20 separated by an area or strip 22 free of conductor ends. In the drawing the ends of the conductors on the chip mounting surface are shown as dashes (-) which roughly approximates their shape. When surface metallization connects to the conductor ends, as will be described infra, this connection is shown by a circle around the dash. The respective conductors are designated in FIG. 1 by the reference characters 14a, 14c, and 14d at the left hand side. Each dash on the same horizontal line is on the same lamina. The interconnect pattern can be determined from FIGS. 2, 3 and 4. With this technique alternate patterns and conductor free strips can be repeated many times.

The spacing of the conductor ends within each of the patterns 20 is so arranged that there is space provided within the patterns to provide for chip mounting sites. These sites can accommodate chip mounting metal pads 24 which are suitable for flip chip bonding of semiconductor chips as well as surface metallization or wiring 26 for connecting chip pads, and/or conductor ends. (This arrangement can also be utilized for wire bonding, or other types of chip bonding.) These pads 24 can be arranged within the site to accommodate selected chips which are to be mounted on the substrate and interconnected thereto by conventional flip chip solder bonding techniques. It will be apparent that many different configurations of chip mounting pads 24 or wiring metallization could be applied at each of the patterns to accommodate the requisite selection of chip mix which is to be used on the substrate. This then allows for the personalization of a single substrate to accommodate a wide variety and mix of chips. Four possible chips in two adjacent patterns are shown, the chips being designated 28, 30, 32, and 34.

Figure 2:
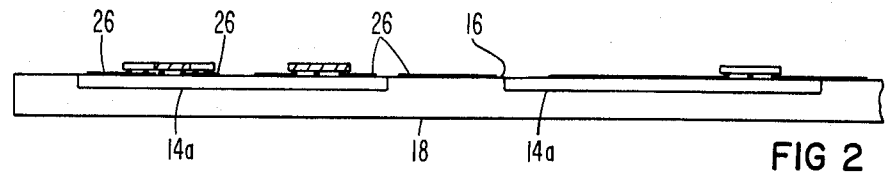
FIG. 2 is a sectional view taken substantially along the plane designated by line 2—2 of FIG. 1.
Figure 3:
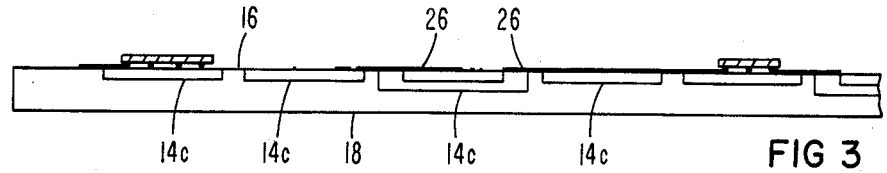
FIG. 3 is a sectional view taken substantially along the plane designated by the line 3—3 of FIG. 1.
Figure 4:
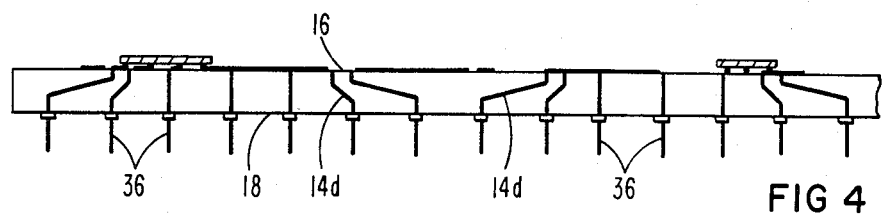
FIG. 4 is a sectional view taken substantially along the plane designated by the line 4—4 of FIG. 1.

A combination of the subsurface conductors 14a, 14c, 14d, and mounting surface wiring 26 interconnect the various chips 28, 30, 32, and 34 together, and to input/output (I/O) pins 36 are attached to the rear surface 18 of the substrate. In some cases other types of I/O connections such as edge connections or "bump" connections may be employed rather than I/O pins. As can be seen in FIGS. 1, 2 and 3, the configuration of the conductors 14a and 14c provide subsurface connection between various points on the chip mounting surface. For example, the conductors 14a provide wiring connection between one extreme side of a pattern and the other side, while the conductors 14c provide wiring connections within each pattern as well as subsurface connection between one pattern and the next adjacent pattern beneath the strip 22 on the mounting surface.

The strip 22 on the mounting surface provides a relatively large surface area free of the ends of conductor to accommodate a large amount of surface wiring which may require long orthogonal segments, and which wiring connects both conductor ends in the same pattern as well as conductor ends from one pattern across the strip 22 to the conductor ends in the next pattern. Thus by the use of repeating conductor end patterns on the surface interconnected by subsurface conductors together with spaces between the repeating pattern for wiring having long orthogonal segments a single substrate can be used for many combinations of chips.

Figure 6A:
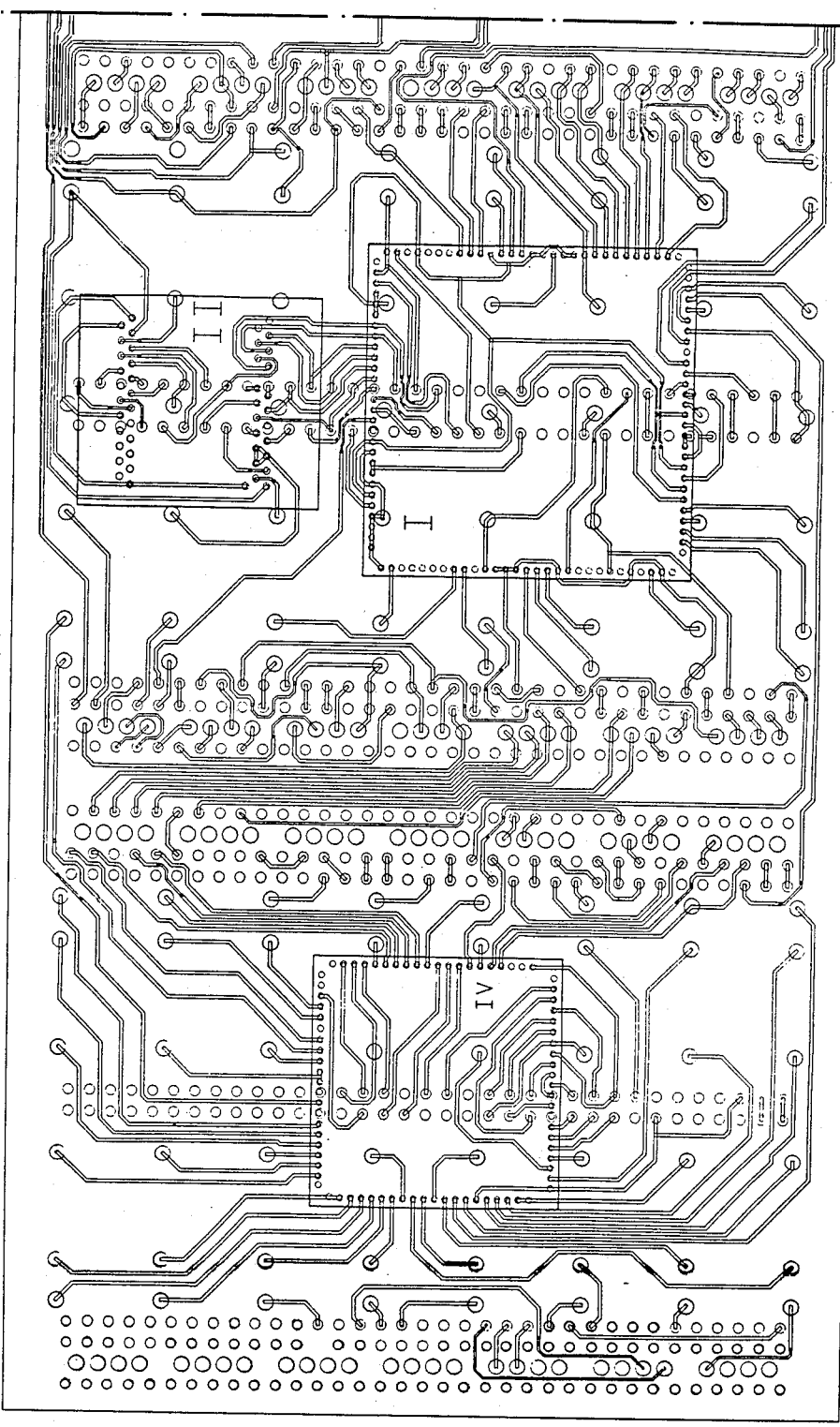
Figure 6B:
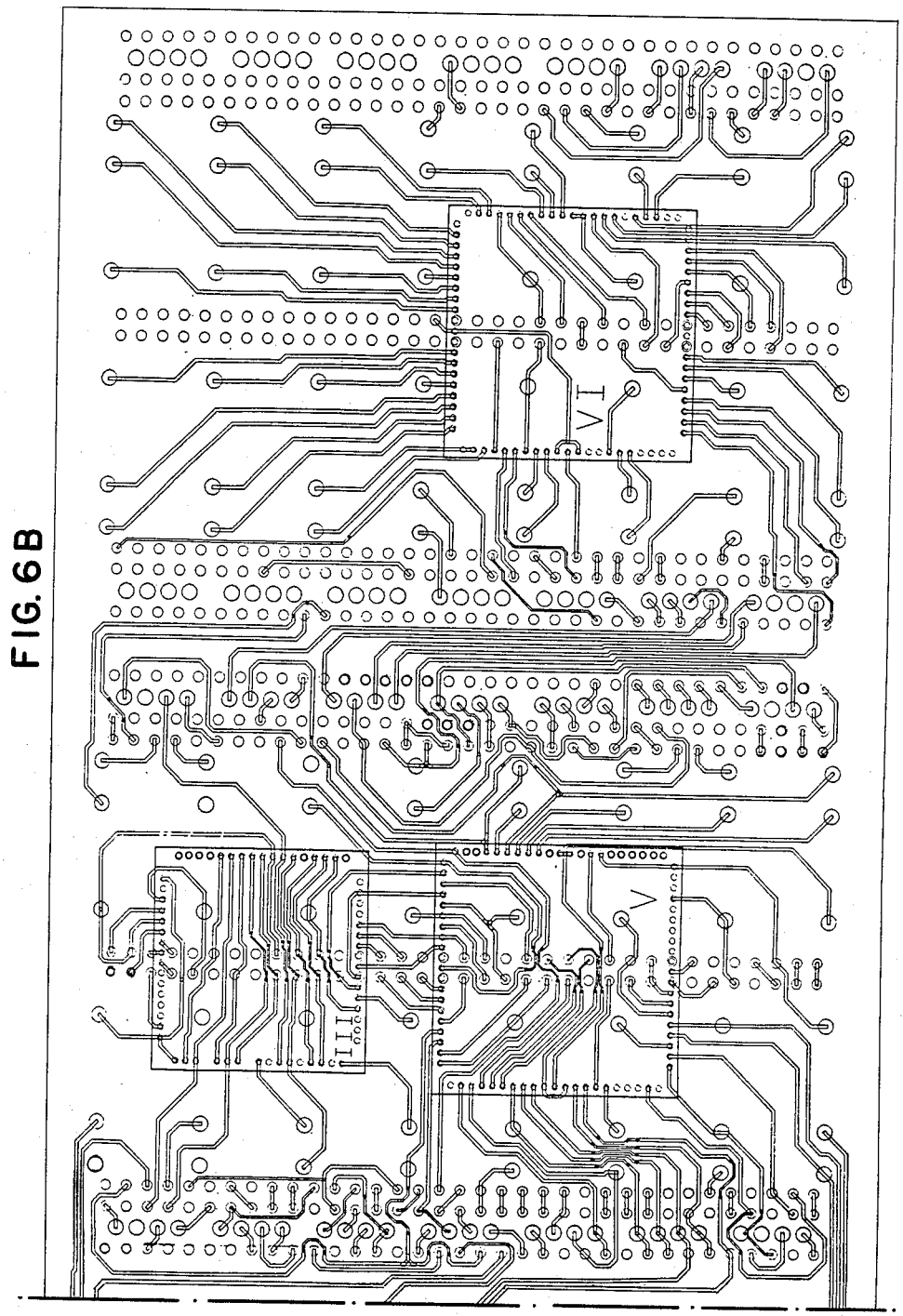

It should be noted that the figures are somewhat simplified in several respects from conventional actual physical embodiments for the purpose of clarification. The modifications include showing only a few laminae forming a substrate whereas many more could be used to provide denser connection and/or a wider substrate. Also, only a selected sample of surface connections and wiring is shown, and this wiring could be much denser. Also, most chips would have more solder connection points than those shown. However, for the sake of clarity, a minimal showing of these various elements is made to illustrate the invention. FIGS. 6A and 6B show a more detailed embodiment of the invention which clearly illustrates the multiple chip mounting and high density features of the invention.

The above described technique of forming the substrate from laminae utilizing the edges thereof to form the chip mounting surface is the preferred technology. However, the technology using laminae bonded together in face-to-face relationship with the face of one lamina as the surface as disclosed in said *IBM Technical Disclosure Bulletin*, Vol. 22, No. 5, October 1979, at pages 1841-1842 could also be used.

What is claimed is:

1. A personalizable masterslice substrate for semiconductor chips comprising:
    an insulating block of material having a chip mounting surface and a reverse surface opposite said chip mounting surface;
    said block of material being formed of a plurality of rectangular planar faced dielectric laminae bonded together at said planar faces thereof;
    said plurality of rectangular planar faced dielectric laminae having edge surfaces, a first edge surface being said chip mounting surface, an opposite edge surface being said reverse surface;
    a plurality of conductors formed in longitudinally repeating conductor patterns on selected ones of said plurality of rectangular planar faced dielectric laminae, adjacent ones of said selected ones of said plurality of rectangular planar faced dielectric laminae having different conductor patterns;
    at least some of said plurality of conductors terminating at a first portion of said chip mounting surface and forming a first surface pattern of conductor ends thereon;
    at least some others of said plurality of conductors terminating at a first portion of said chip mounting surface and forming a second surface pattern of conductor ends thereon;
    the first and second surface patterns of conductor ends being identical and spaced from each other by a third portion of said chip mounting surface containing no conductor ends;
    a first plurality of chip site determining metal pads formed only on selected ones of said plurality of conductor leads terminating at the first portion of said chip mounting surface, forming a first pattern of metal pads;
    at least a second plurality of chip site determining metal pads formed only on selected ones of said conductor leads terminating at the second portion of said chip mounting surface, forming a second pattern of metal pads;
    the first and second patterns of metal pads being different, thereby providing a plurality of chip mounting sites differing in size, location and connection patterns, said chip mounting sites being personalizable by the forming of metal pads on only selected ones of said plurality of conductor leads terminating at the edge surface being said chip mounting surface.

2. A personalizable masterslice substrate for mounting a plurality of semiconductor chips differing in size and conductor pattern at variable locations thereon, comprising:
    an insulating block of material having a chip mounting surface and a reverse surface opposite said chip mounting surface, said insulating block of material comprising a plurality of dielectric laminae, each of said plurality of dielectric laminae having two face portions and two end portions, said plurality of dielectric laminae being bonded together at said face portions thereof to form said insulating block of material, one of said end portions of said plurality of dielectric laminae defining said chip mounting surface of said insulating block of material and the other of said end portions of said plurality of dielectric laminae defining said reverse surface of said insulating block of material; and a plurality of conductors disposed on one of said face portions of each of said plurality of dielectric laminae, said plurality of conductors comprising two end portions and an intermediate portion interconnecting said two end portions, wherein most of said end portions of said plurality of conductors terminate at said chip mounting surface and at least some of said end portions of said plurality of conductors terminate at said reverse surface, said plurality of conductors being formed in a longitudinally repeating conductor pattern on said face portion of each of said plurality of dielectric laminae, adjacent ones of said plurality of dielectric laminae having different conductor patterns, said end portions of said plurality of conductors terminating at said chip mounting surface forming longitudinally repeating conductor end surface patterns on said chip mounting surface, selected ones of said plurality of conductor end portions being metallized to delineate a plurality of chip site determining metal pads, said plurality of chip site determining metal pads defining chip sites which selectively differ in size, location and connection pattern, said chip sites being selectively interconnected by a plurality of surface conductors as well as by intermediate portions of other selected ones of said plurality of conductors having both end portions terminating at said chip mounting surface.

3. A personalizable masterslice chip mounting means for mounting semiconductor chips which differ in size and connection pattern, comprising:

a transverse via substrate having a chip mounting surface and a reverse surface opposite said chip mounting surface, said substrate having a plurality of exposed conductor ends formed in a longitudinally repeating conductor end surface pattern on said chip mounting surface;

each of said exposed conductor ends being interconnected to another of said exposed conductor ends by subsurface conductors disposed beneath said chip mounting surface, said subsurface conductors and said exposed conductor ends being formed in a series of orthogonally different, longitudinal subsurface conductor patterns, selected ones of said exposed conductor ends being metallized to form a plurality of chip site determining metal pad patterns which selectively differ in size, location and connection pattern;

at least some of said selected ones of said exposed conductor ends being interconnected by surface conductors disposed on said chip mounting surface.

* * * * *